(12) United States Patent
Itkin et al.

(10) Patent No.: US 8,060,025 B2
(45) Date of Patent: Nov. 15, 2011

(54) FILTER ARRANGEMENT AND METHOD FOR FILTERING A SIGNAL

(75) Inventors: Grigory Itkin, München (DE); Nikolai Filimonov, München (DE); Oleg Varlamov, Moskau (RU); Igor Chugunov, Moscow (RU); Viktor Gromorushkin, Moscow (RU)

(73) Assignee: Infineon Technologies AG, Neubiberg (DE)

( * ) Notice: Subject to any disclaimer, the term of this patent is extended or adjusted under 35 U.S.C. 154(b) by 1447 days.

(21) Appl. No.: 11/540,843

(22) Filed: Sep. 29, 2006

(65) Prior Publication Data

US 2007/0123199 A1    May 31, 2007

(30) Foreign Application Priority Data

Sep. 30, 2005   (DE) .......................... 10 2005 047 135

(51) Int. Cl.
  *H04B 1/38* (2006.01)
(52) U.S. Cl. ........... 455/73; 455/293; 455/296; 455/403
(58) Field of Classification Search .................... 455/73, 455/293, 296, 403
  See application file for complete search history.

(56) References Cited

U.S. PATENT DOCUMENTS

| | | | |
|---|---|---|---|
| 3,579,135 A * | 5/1971 | Anderson | ...................... 330/252 |
| 4,984,292 A | 1/1991 | Millen | |
| 5,065,453 A | 11/1991 | Thomas | |
| 5,444,864 A | 8/1995 | Smith | |
| 5,499,002 A * | 3/1996 | Kinsman | ...................... 333/187 |
| 5,721,518 A | 2/1998 | Hahn | |
| 6,020,783 A | 2/2000 | Coppola | |
| 6,084,486 A | 7/2000 | Suzuki et al. | |
| 6,268,766 B1 | 7/2001 | Thomasson | |
| 6,472,956 B2 | 10/2002 | Kosuga | |
| 6,636,128 B2 * | 10/2003 | Rauscher | ...................... 333/175 |
| 6,809,581 B2 | 10/2004 | Rofougaran et al. | |
| 2002/0072344 A1 | 6/2002 | Souissi | |
| 2004/0251964 A1 * | 12/2004 | Weldon | ......................... 330/149 |

FOREIGN PATENT DOCUMENTS

| | | |
|---|---|---|
| DE | 10 2004 025 576 A1 | 12/2005 |
| EP | 1 059 735 A1 | 12/2000 |
| EP | 1 091 497 A1 | 4/2001 |

OTHER PUBLICATIONS

"High-Q RF coils on silicon integrated circuits", Christopher L. Chua, David K. Fork, Koenraad Van Schuylenbergh and Jeng-Ping Lu, MEMS Components and Applications for Industry, Automobile, Aerospace, and Communication II, Proceedings of SPIE, vol. 4981, 2003, pp. 150-155.

* cited by examiner

*Primary Examiner* — Tuan H Nguyen
(74) *Attorney, Agent, or Firm* — Eschweiler & Associates, LLC

(57) ABSTRACT

A filter arrangement comprises a first impedance, a second impedance and a subtractor. The first impedance comprises a first connection connected to an input of the filter arrangement and has a first resonant frequency. The second impedance comprises a first connection likewise connected to the input of the filter arrangement and has a second resonant frequency which is higher than the first resonant frequency. The subtractor comprises a first input connected to a second connection of the first impedance, comprises a second input connected to a second connection of the second impedance, and comprises a first connection of the output connected to a first output of the filter arrangement.

22 Claims, 5 Drawing Sheets

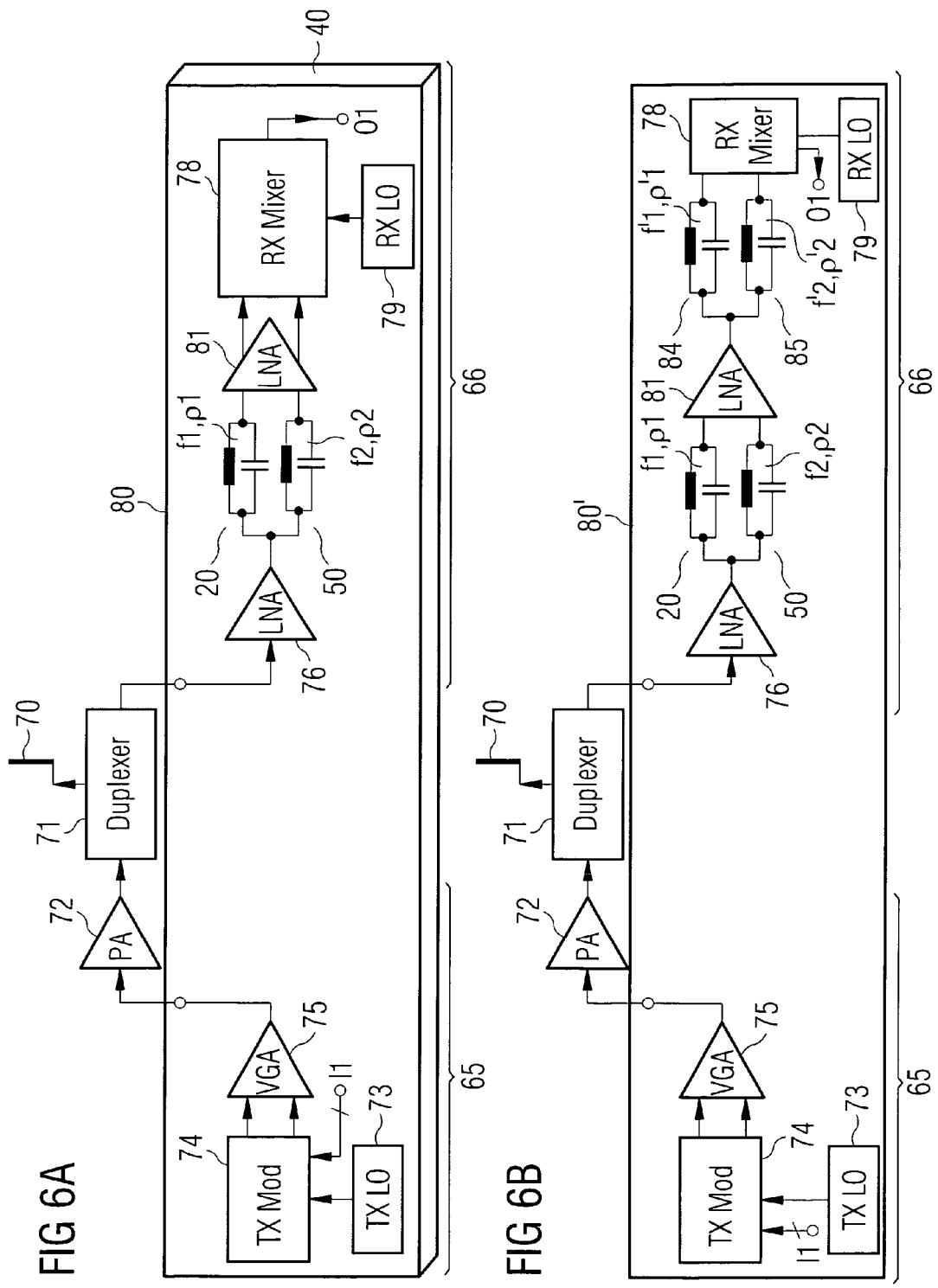

US 8,060,025 B2

FILTER ARRANGEMENT AND METHOD FOR FILTERING A SIGNAL

REFERENCE TO RELATED APPLICATIONS

This application claims the benefit of the priority date of German application DE 10 2005 047 135.8, filed on Sep. 30, 2005, the contents of which are herein incorporated by reference in their entirety.

FIELD OF THE INVENTION

The invention relates to the field of electronics and primarily to a filter arrangement, a transceiver arrangement having the filter arrangement, a use for the filter arrangement and also a method for filtering an input signal.

BACKGROUND OF THE INVENTION

Transmission and reception arrangements in mobile radio communication, also called transceivers, are usually coupled to an antenna by means of a duplexer. Isolation of a received signal from a transmitted signal is ensured by the duplexer. To eliminate interference, an additional reduction in transmitted signal influence on the received signal may be necessary. This is the case, by way of example, with code-division multiple access (CDMA for short) methods and also for wideband code-division multiple access (WCDMA for short) and for the universal mobile telecommunication system (UMTS for short).

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

One embodiment relates to a method for selectively passing a first signal to an output of a filter arrangement, wherein the first signal has a first frequency. The first signal is compared to a second signal that has a second frequency that is higher than the first frequency. The first signal is passed if the first signal is approximately in phase opposition to the second signal. Conversely, the first signal is rejected if the first signal is approximately in phase with the second signal.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

The invention is explained in more detail below using a plurality of exemplary embodiments with reference to the figures.

FIGS. 6A to 6C show embodiments of a transceiver arrangement with one filter arrangement.

DETAILED DESCRIPTION OF THE INVENTION

Components which have the same function or action bear the same reference symbols. Where circuit parts correspond in terms of components and their function, a description thereof is not repeated in each of the following figures.

Figure 1A:
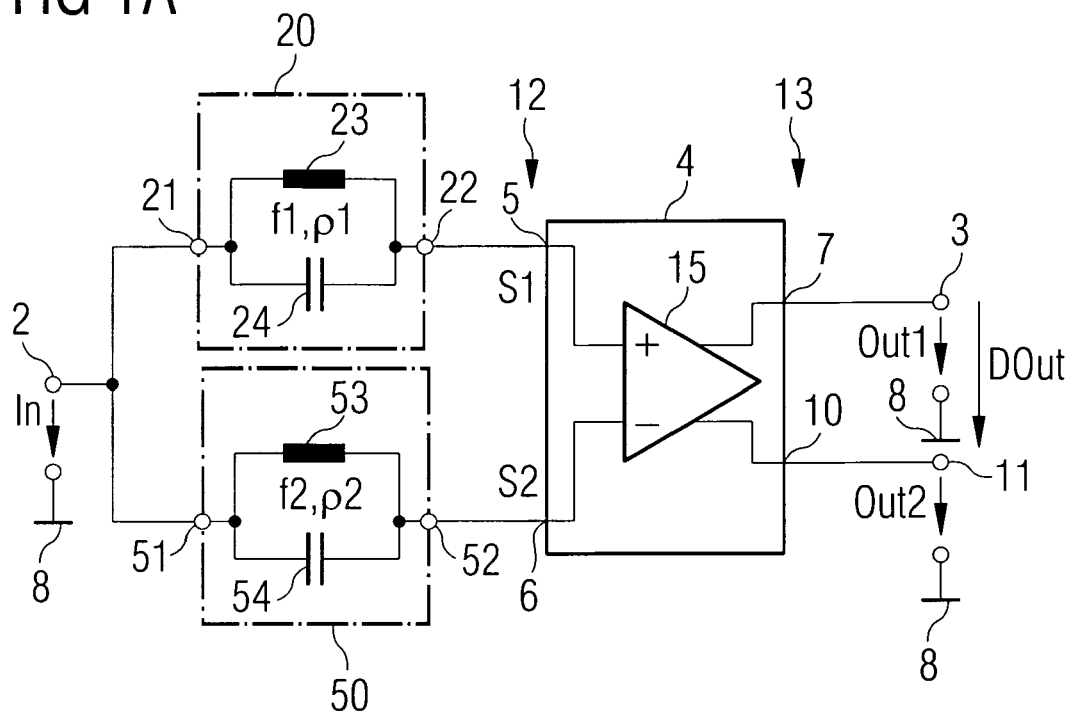
FIGS. 1A and 1B show embodiments of filter arrangements based on the proposed principle.

FIG. 1A shows an exemplary embodiment of a filter arrangement based on the proposed principle.

The filter arrangement comprises an input 2, a first output 3 and a second output 11. The input 2 of the filter arrangement is connected to a first connection 21 of a first impedance 20 and also to a first connection 51 of a second impedance 50. The first impedance 20 has a parallel circuit comprising a first inductive component 23 and a first capacitive component 24. A second connection 22 of the first impedance 20 is connected to an input 5 of a subtractor 4. A first terminal of the first inductive component 23 is coupled to a first terminal of the first capacitive component 24 and to the first connection 21 of the first impedance 20. A second terminal of the first inductive component 23 is coupled to a second terminal of the first capacitive component 24 and to the second connection 22 of the first impedance 20.

The second impedance 50 has a parallel circuit comprising a second inductive component 53 and a second capacitive component 54. A second connection 52 of the second impedance 50 is connected to a second input 6 of the subtractor 4. A first terminal of the second inductive component 53 is coupled to a first terminal of the second capacitive component 54 and to the first connection 51 of the second impedance 50. A second terminal of the second inductive component 53 is coupled to a second terminal of the second capacitive component 54 and to the second connection 52 of the second impedance 50.

The subtractor 4 comprises a differential amplifier 15. The two inputs of the differential amplifier 15 are connected to the first and second inputs 5, 6 of the subtractor 4. An output 7 of the subtractor 4 is connected to an output of the differential amplifier 15 and is coupled to the output 3 of the filter arrangement. A second output 10 of the subtractor 4 is connected to a further output of the differential amplifier 15 and is coupled to the output 11 of the filter arrangement.

The parallel resonant circuit of the first impedance 20 has a resonant frequency f1 and a characteristic impedance ρ1. Accordingly, the parallel resonant circuit of the second impedance 50 has a second resonant frequency f2 and a second characteristic impedance ρ2.

The input 2 of the filter arrangement has an input signal In applied to it. The first input 5 of the subtractor 4 is supplied with a signal S1 via the first impedance 20, and the input 6 of the subtractor 4 is supplied with a signal S2 via the second impedance 50. A subtracted signal can be tapped off on the output of the differential amplifier 15 and hence on the first connection 7 of the subtractor 4. The output 3 of the filter arrangement produces the output signal Out1. The further output of the differential amplifier 15 and hence the second connection 10 of the subtractor 4 and also the output 11 of the filter arrangement can be used to tap off an output signal Out2. The output 3 and the output 11 of the filter arrangement have a differential signal DOut between them which has a value for a difference in the two output signals Out1 and Out2.

Advantageously, the input signal In to be passed has its phase angle rotated by the two impedances 20, 50 such that the phase difference in the two signals S1, S2 is almost 180 angular degrees upon being supplied to the subtractor 4. The input signal at this frequency is therefore passed. Advantageously, an input signal at a frequency which is intended to be suppressed is either not altered in terms of a phase angle or is rotated through the same phase by both impedances 20, 50, so that the two signals S1, S2 appear with essentially the same phase on the two inputs 5 and 6 of the subtractor 4 and are therefore almost eliminated by the subtractor 4.

The first impedance 20 and the second impedance 50 according to FIG. 1A are each band-stop filters. The filter arrangement, comprising the first and the second impedances 20, 50 and the subtractor 4, is a band-pass filter.

In an embodiment, the first and the second capacitive components 24, 54 each comprise several capacitors which are coupled together in the form of series circuits and/or parallel circuits.

Figure 1B:
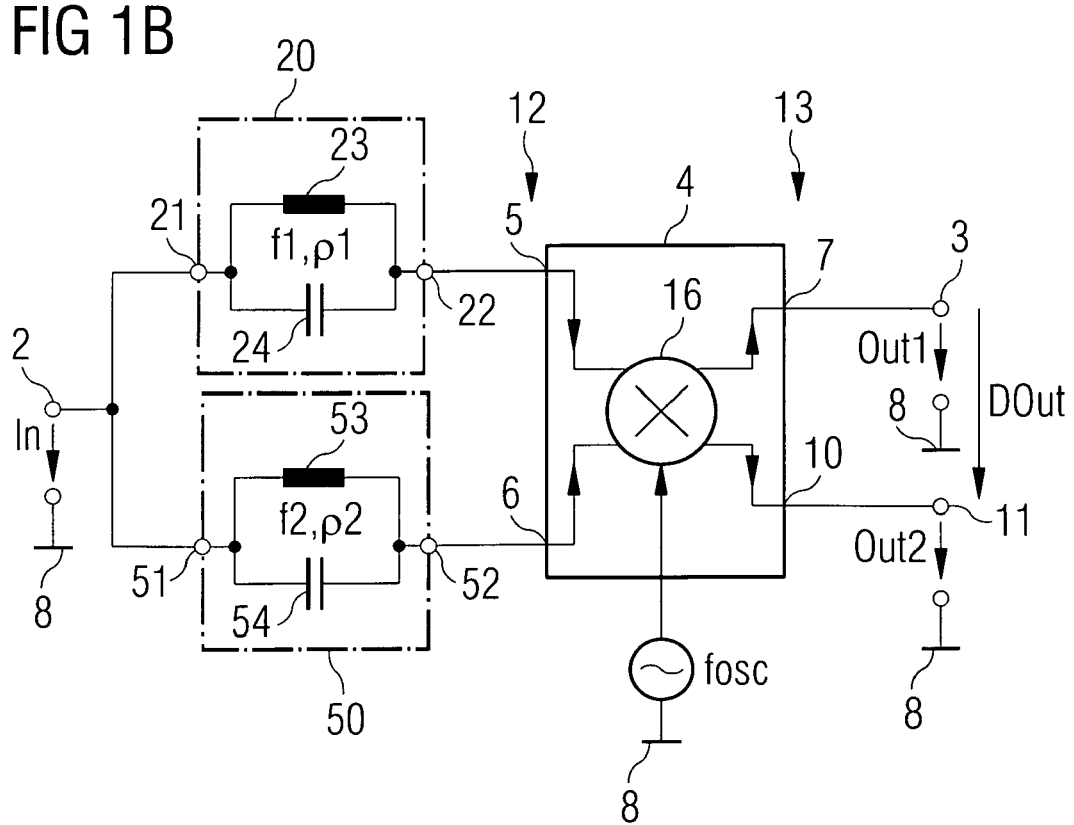

FIG. 1B shows another exemplary embodiment of a filter arrangement based on the proposed principle. In contrast to the filter arrangement shown in FIG. 1A, the filter arrangement shown in FIG. 1B has the subtractor 4 in the form of a mixer 16. The mixer is implemented as a frequency mixer.

The mixer 16 has a first input connected to the first input 5 of the subtractor 4 and has a second input connected to the second input 6 of the subtractor 4. The mixer is in the form of a down-conversion mixer. One output of the mixer 16 has the first connection 7 of the subtractor 4 connected to it, and another output of the mixer 16 has the second connection 10 of the subtractor 4 connected to it.

A further input of the mixer is supplied with a radio-frequency signal at an oscillator frequency fosc. The radio-frequency signal is output by an oscillator. An output of the mixer and hence the first connection 7 of the subtractor 4 or the output 3 of the filter arrangement have a down-converted and simultaneously filtered output signal Out1 on them.

The task of down-conversion mixing can therefore advantageously be implemented with the task of filtering in an arrangement.

Figure 2A:
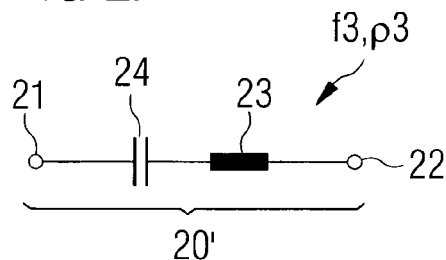
FIGS. 2A and 2B show embodiments of a first and a second impedance.
Figure 2B:
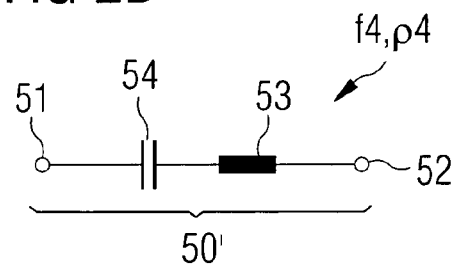

FIGS. 2A and 2B show exemplary further embodiments of a first and a second impedance. These can be used in the filter arrangements shown in FIGS. 1A and 1B instead of the parallel circuits.

FIG. 2A shows a series resonant circuit, having the first inductive component 23 and the first capacitive component 24, as first impedance 20'. The series resonant circuit has a third resonant frequency f3 and a third characteristic impedance ρ3.

FIG. 2B shows an exemplary embodiment of the second impedance, whose design is based on that of the arrangement in FIG. 2A. The second impedance 50' shown in FIG. 2B comprises a series resonant circuit. The series resonant circuit has the second inductive component 53 and the second capacitive component 54 and also the fourth resonant frequency f4 and the fourth characteristic impedance ρ4.

The first impedance 20' and the second impedance 50' according to FIGS. 2A and 2B are each band-pass filters. A filter arrangement, comprising the first and the second impedances 20', 50' and the subtractor 4, is a band-stop filter.

Figure 3A:
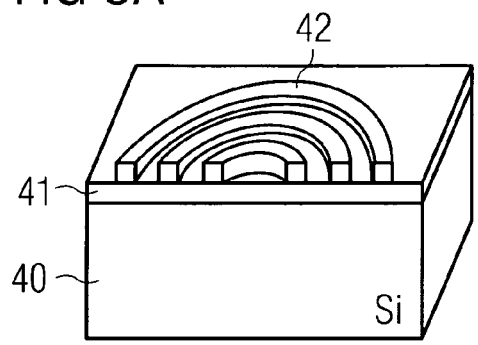
FIGS. 3A and 3B show embodiments of an inductive component.

FIG. 3A shows an exemplary embodiment of an inductive component, as can be used in a first and/or second impedance 20, 20', 50, 50', in a cross section. The inductive component is implemented on a semiconductor body 40 and comprises a spirally shaped interconnect 42 which has been put on a dielectric layer 41.

An inductive component can therefore advantageously be implemented on a semiconductor body using steps from semiconductor technology or thin-film technology, which means that external inductances with supply lines to the semiconductor body can be dispensed with.

Figure 3B:
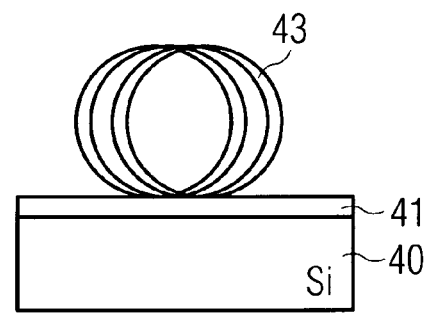

FIG. 3B likewise shows an exemplary embodiment of an inductive component, as can be used in a first and/or second impedance 20, 20', 50, 50', in a cross section. The inductive component comprises an interconnect 43 which protrudes from the plane of the semiconductor body 40. Between the semiconductor body 40 and the interconnect 43 there is a dielectric layer 41.

Figure 4:
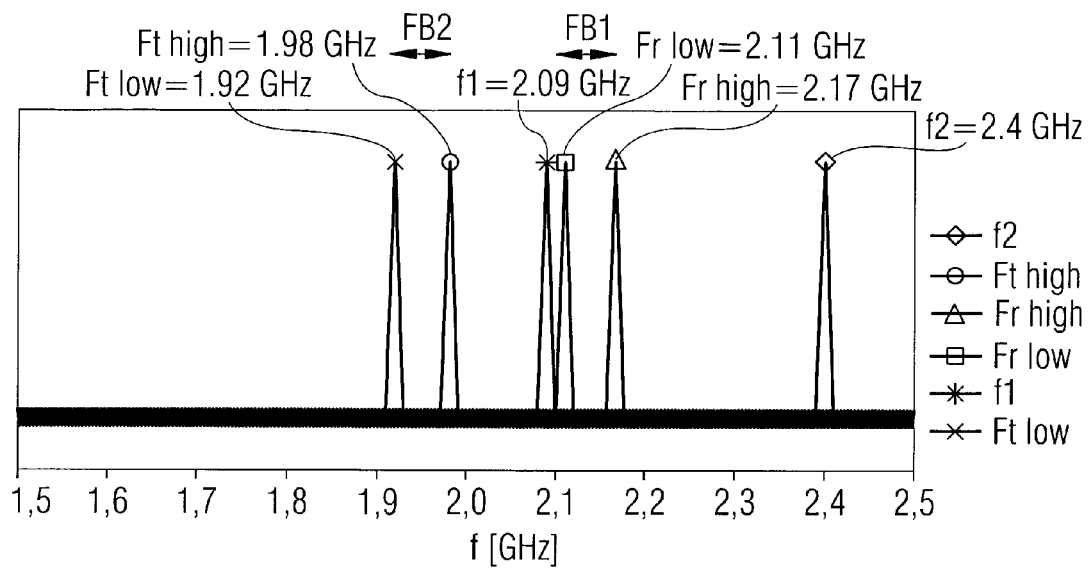
FIG. 4 shows an exemplary frequency distribution for a transceiver chip in which a filter arrangement can be used.

FIG. 4 shows an exemplary distribution for frequencies in a transceiver chip. The signals which arise are plotted against frequency.

The reception frequency range forms a first frequency range FB1, which is to be passed by the filter arrangement contained in the receiver. The reception frequencies are in a range between a frequency Fr low with a value of 2.11 GHz and a frequency Fr high with a value of 2.17 GHz. The transmission frequency range is a second frequency range FB2, which is to be rejected by the filter arrangement, and is between a frequency Ft low with a value of 1.92 GHz and a frequency Ft high with the value of 1.98 GHz.

The reception range is at higher frequencies than the transmission range. The first impedance has a first resonant frequency f1 with a value of 2.09 GHz and the second impedance has a second resonant frequency f2 with a value of 2.4 GHz. The first resonant frequency f1 provided is therefore a frequency between the transmission and reception frequency ranges FB1, FB2. The second resonant frequency f2 set up is a frequency which is higher than the frequencies of the reception frequency range FB1.

Figure 5:
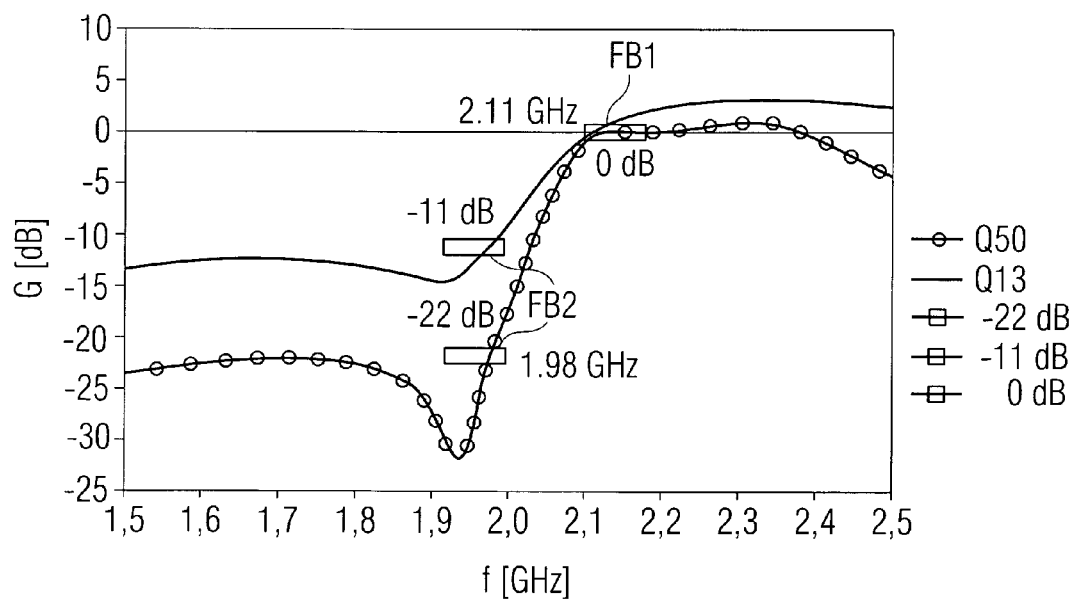
FIG. 5 shows results which relate to one embodiment of a filter arrangement.

FIG. 5 shows a possible frequency response from a possible filter arrangement based on the proposed principle. A y axis plots a gain factor G and an X axis plots a frequency f for the input signal In. The entered frequency ranges are based on the UMTS FDD Band 1 standard. The parameter chosen for the two curves is the quality of the inductive components. An inductive component as shown in FIG. 3A may have a quality of approximately 13, for example, whereas an inductive component as shown in FIG. 3B may have a quality of 50, for example.

In line with FIG. 4, the range of the frequencies FB2 which are to be rejected is between approximately 1.92 GHz and 1.98 GHz. The range of the frequencies FB1 which are to be passed is approximately between 2.11 GHz and 2.2 GHz. The range of the frequencies FB1 which are to be passed contains the gain factor 0 dB for both variants of the inductive components. The range of the frequencies FB2 which are to be rejected contains the gain factor −11 dB in the case of the inductive components with the quality 13 and −22 dB in the case of the inductive components with the better quality. To achieve adequate isolation between the received and transmitted signals even with components of the lesser quality, it may be advantageous to connect two or three filter arrangements based on the proposed principle in series with one another.

FIG. 6A shows an exemplary embodiment of a transceiver arrangement with a filter arrangement based on the proposed principle.

The transceiver arrangement comprises a semiconductor body 40 having a transceiver circuit arrangement 80 and also a power stage 72, a duplexer 71 and an antenna 70. The transceiver arrangement is in the form of a radio-frequency full-duplex transceiver.

The transceiver circuit arrangement 80 has a local oscillator 73 whose output is connected to an input of a modulator 74. A differential output of the modulator 74 is connected to an input of an amplifier 75 with a variable gain factor. An output of the amplifier 75 with the variable gain factor is connected to an output of the semiconductor body 40. The output of the semiconductor body 40 has a power stage 72 connected to it whose output is connected to a duplexer 71. The duplexer 71 is linked to the antenna 70.

Another output of the duplexer 71 is connected to an input of the transceiver circuit arrangement 80 on the semiconductor body 40. The input is connected to an input of a low-noise amplifier 76. The amplifier 76 has a filter arrangement based on the proposed principle connected downstream of it. The filter arrangement comprises a first and a second impedance 20, 50 and a low-noise amplifier 81. A differential output of the amplifier 81 is connected to a differential input of a mixer 78. In addition, the semiconductor body 40 comprises a further local oscillator 79 which has an output connected to a frequency input of the mixer 78.

The modulator 74 is supplied with a signal containing a piece of information I1 to be transmitted and with a radio-frequency signal which is provided by the local oscillator 73. A modulated signal is supplied via the amplifier 75 to the power amplifier 72. A signal on the output of the power amplifier 72 is supplied to an input of the duplexer 71 and is transferred from the duplexer 71 to the antenna 70 and transmitted by the antenna 70.

A signal received by the antenna 70 is supplied via the duplexer 71 to the low-noise amplifier 76, whose output is connected to the filter arrangement with the first and second impedances 20, 50. For the purpose of operating the mixer 78, it is supplied with a radio-frequency signal which is provided by the further local oscillator 79.

The filter arrangement is designed to filter the signal which is on the output of the amplifier 76 and to supply it to the inputs of the mixer 78. An output of the mixer can be used to tap off the transceiver output signal O1 which is to be processed further.

Advantageously, the transceiver arrangement shown in FIG. 6A is used to reduce interference in the reception path by signals at frequencies in the transmission range on account of the filtering provided.

FIG. 6B shows an embodiment of the transceiver arrangement shown in FIG. 6A. In contrast to the transceiver arrangement shown in FIG. 6A, the transceiver arrangement shown in FIG. 6B contains a further first impedance 84 and a further second impedance 85. The further first impedance 84 and the further second impedance 85 have their input connected to the output of the amplifier 81. The further first impedance 84 and the further second impedance 85 have their output linked to the two inputs of the mixer 78.

Two filter arrangements are therefore advantageously connected in series with one another.

Figure 6C:
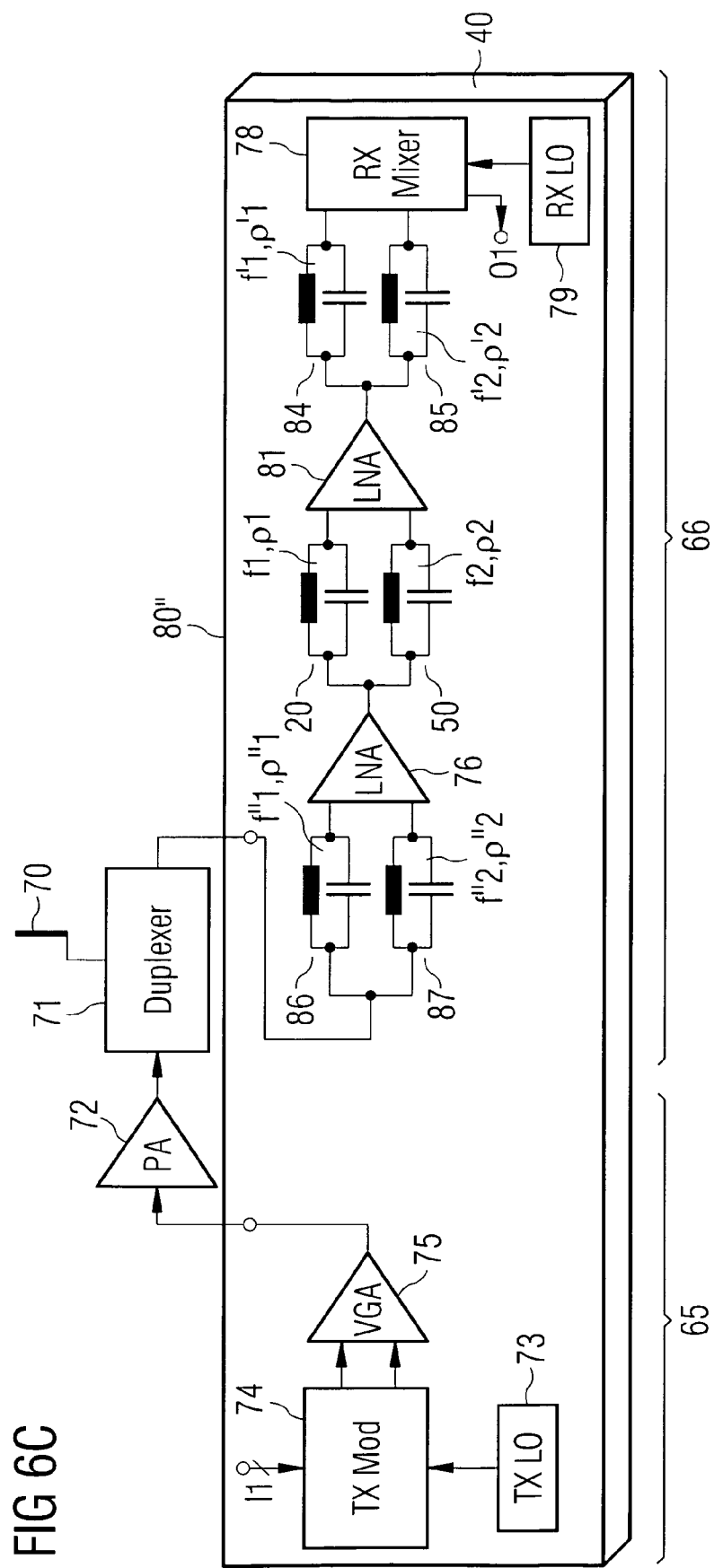

FIG. 6C shows a transceiver arrangement which is an embodiment of the transceiver arrangement shown in FIG. 6B. In contrast to the transceiver arrangement shown in FIG. 6B, the amplifier 76 shown in FIG. 3C has a differential input in the reception path. Another first impedance 86 is connected between the input of the semiconductor body 40 and a first input of amplifier 76. In addition, another second impedance 87 is connected between the input of the semiconductor body 40 and the second input of the amplifier 76.

The reception path therefore advantageously has three filter arrangements connected in series with one another. In this case, components as are also provided for performing other tasks in the reception path are used for filtering.

Figure 7A:
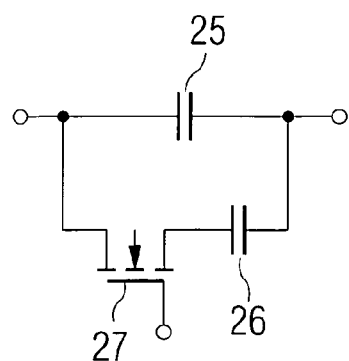
FIGS. 7A and 7B show embodiments of a capacitive component.

FIG. 7A shows an exemplary embodiment of a capacitive component as can be used in a first and/or second impedance 20, 20', 50, 50'. The capacitive component in FIG. 7A has a first capacitor 25 which is connected in parallel with a series circuit, comprising a second capacitor 26 and a transistor 27. The transistor 27 is in the form of a metal oxide semiconductor field effect transistor. When the transistor 27 is in a closed operating state, a total capacitance for the arrangement shown in FIG. 7A is a sum comprising a capacitance value for the first capacitor 25 and a capacitance value for the second capacitor 26. When the transistor 27 is in an open operating state, the total capacitance of the arrangement shown in FIG. 7A is the capacitance value of the first capacitor 25.

The capacitance value of a capacitive component of the first and/or second impedance is therefore advantageously adjustable.

Figure 7B:
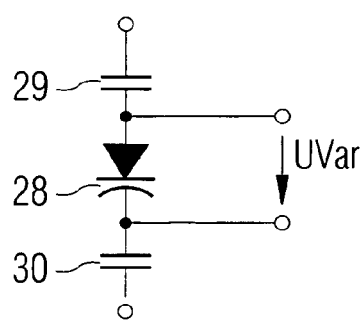

FIG. 7B shows another exemplary embodiment of a capacitive component 24, 54, as can be used in a first and/or second impedance 20, 20', 50, 50', and which has an adjustable capacitance value.

The capacitive component shown in FIG. 7B comprises a varactor diode 28 and two further capacitors 29, 30 which are connected in series with one another. A capacitance value for the varactor diode 28 and hence for the total arrangement in FIG. 7B can be adjusted by means of a DC voltage UVar. The further capacitors 29, 30 are used for injecting the DC voltage UVar.

In one embodiment, a filter arrangement, particularly for a transceiver arrangement, comprises a first impedance which comprises a first connection connected to an input of the filter arrangement and has a first resonant frequency f1; a second impedance which comprises a first connection connected to the input of the filter arrangement and has a second resonant frequency f2 which is higher than the first resonant frequency f1, wherein the first impedance and the second impedance respectively comprise an inductance/capacitance circuit; a subtractor having two inputs and a first output, wherein a first input is connected to a second connection of the first impedance, a second input is connected to a second connection of the second impedance, and a first connection of the output is connected to the first output of the filter arrangement.

In another embodiment, a filter arrangement comprises a subtractor whose two inputs are preceded by a respective impedance which in turn can both have an input signal which is to be filtered applied to their input, with a difference in the phase rotation produced by the two impedances at the respective output in a passable frequency range of the filter arrangement being approximately 180°.

In a further embodiment, a method for filtering an input signal comprises: the input signal is supplied to two impedances which prompt a respective frequency-dependent phase shift and comprise a respective inductance/capacitance circuit; a first and a second signal, which can be tapped off from the output of the two impedances, are subtracted; an output signal is provided on the basis of a result from the subtraction.

In an additional embodiment, a filter arrangement comprises a first impedance, a second impedance and a subtractor. The first impedance has a first connection coupled to an input of the filter arrangement. The first impedance has a first resonant frequency. The second impedance likewise has a first connection coupled to the input of the filter arrangement. The second impedance has a second resonant frequency which is higher than the first resonant frequency. The subtractor has two inputs and an output. The first input is coupled to a second connection of the first impedance. Accordingly, a second input is coupled to a second connection of the second impedance. A first connection of the output of the subtractor couples the latter to a first output of the filter arrangement.

Since the first impedance and the second impedance both have their input coupled to the input of the filter arrangement, an input signal can be supplied both to the first and to the second impedance. The input of the subtractor can be supplied both with a signal which can be tapped off at the second connection of the first impedance and with a signal which can be tapped off at the second connection of the second impedance. The first connection of the output of the subtractor and hence the downstream first output of the filter arrangement can be used to tap off an output signal as the result from the subtractor.

Advantageously, an input signal at a frequency at which the first impedance and the second impedance do not have different impedance values is supplied to the first and second inputs of the subtractor in the same way. In this manner, the subtractor reduces the signal level of this input signal. The signals essentially cancel out one another upon subtraction.

Advantageously, an input signal at a frequency at which the first and second impedances have different impedance values can be passed by the filter arrangement.

In one embodiment, the first and second impedances are designed such that the signals on the second connections of the first and second impedances are approximately in phase opposition to one another for a predetermined frequency range. The frequencies at which the two impedances exhibit this response and which are therefore passed by the filter arrangement are covered by a first frequency range. The first frequency range can also be called a passable frequency range.

In one embodiment, the first and second impedances are set up such that the respective second connections of the first and second impedances can be used to tap off two signals which are approximately in phase with one another in another, predetermined frequency range. The frequencies of such input signals, for which the filter arrangement has a rejecting action, are covered by a second frequency range. The second frequency range can also be called a rejection frequency range. Signals at a frequency in the rejection frequency range essentially cancel out one another on account of the subtraction.

In one embodiment, the angle and the absolute value of the first and second impedances in the second frequency range are approximately of the same magnitude in each case. Advantageously, the phase and the amplitude of the two signals on the second connections of the two impedances are therefore almost of the same magnitude, which means that the output signal associated with the input signal in the second frequency range is greatly attenuated after the subtraction.

If a frequency in the first frequency range is higher than a frequency in the second frequency range then in one embodiment the first impedance is set up such that the first resonant frequency is lower than a frequency in the first frequency range and higher than a frequency in the second frequency range. In this embodiment, the second impedance is set up such that the second resonant frequency is higher than a frequency in the first frequency range.

In one alternative embodiment, a frequency in the first frequency range is lower than a frequency in the second frequency range. In this embodiment, the first impedance is designed such that the first resonant frequency is lower than a frequency in the first frequency range. In addition, the second impedance is designed such that the second resonant frequency is higher than a frequency in the first frequency range and lower than a frequency in the second frequency range.

In one embodiment, the first impedance is implemented as an inductance/capacitance circuit and the second impedance is likewise implemented as an inductance/ capacitance circuit. In one advantageous embodiment, the first impedance and the second impedance have the same circuit design.

In one embodiment, the first impedance has a parallel resonant circuit, comprising a first inductive component and a first capacitive component. In this embodiment, the second impedance likewise has a parallel resonant circuit, comprising a second inductive component and a second capacitive component. An input signal at a frequency which is lower than a resonant frequency for the parallel resonant circuit is affected by the parallel resonant circuit essentially in the manner of an inductive component. For an input signal whose frequency is higher than the resonant frequency of the parallel resonant circuit, the parallel resonant circuit acts essentially in the manner of a capacitive component. A filter arrangement whose first impedance has a parallel resonant circuit and whose second impedance has a further parallel resonant circuit at a higher resonant frequency filters out an input signal at a lower frequency, since the input signal is affected by both impedances essentially in the manner of inductive components. In this case, the two inputs of the subtractor can be supplied with signals of approximately the same amplitude and the same phase which are suppressed to a high degree by means of the subtractor. An input signal at a frequency which is between the first and second resonant frequencies is affected by the first impedance essentially in the manner of a capacitive component and by the second impedance essentially in the manner of an inductive component. The output of the first and the output of the second impedance can thus be used to tap off signals which are rotated through approximately 180° relative to one another. This signal is passed by the subtractor. An input signal at a frequency which is higher than the second resonant frequency is affected by both impedances essentially in the manner of capacitive components. This input signal is therefore almost cancelled out by the subtractor.

In one alternative embodiment, the first impedance and the second impedance respectively comprise a series resonant circuit. The first impedance has a series circuit comprising the first inductive component and the first capacitive component. Accordingly, the second impedance has a series circuit comprising the second inductive component and the second capacitive component. A series resonant circuit affects an input signal at a frequency which is lower than a resonant frequency for the series resonant circuit, essentially as a capacitive component. An input signal at a frequency which is higher than the resonant frequency of the series resonant circuit is affected by the series resonant circuit essentially in the manner of an inductive component. If the first and second impedances in the filter arrangement respectively comprise a series resonant circuit then an input signal at a frequency which is between the two resonant frequencies is passed by the subtractor. An input signal at a frequency which is either below the first resonant frequency or above the second resonant frequency is reduced in amplitude by the subtractor.

In a first embodiment, the subtractor is in the form of a differential amplifier. A differential amplifier may be in the form of a low-noise amplifier, LNA for short.

In a second embodiment, the subtractor is in the form of a mixer which comprises a differential input having two connections. A further input of the mixer can be supplied with a mixed frequency.

In a third embodiment, the subtractor is in the form of an active filter with a differential input.

In other alternative embodiments of the filter arrangement, the subtractor may be replaced, within the context of the proposed principle, by other circuits whose input has two connections and which are designed to subtract a signal on a first connection from a signal on a second connection.

In one embodiment, the filter arrangement has a subtractor which has a respective impedance connected upstream of the two inputs. The two impedances may in turn have an input signal applied to their input. A difference in the phase rotation which can be produced by the two impedances at the respective output is approximately 180 angular degrees or Πfor a predeterminable frequency range.

In one embodiment, a transceiver arrangement having a transmission path and a reception path is provided, the reception path comprising the filter arrangement.

The transmission path may comprise a modulator and/or an amplifier with a variable gain factor and/or a power amplifier. An output of the transmission path can have a duplexer coupled to it, to which an antenna can be coupled. An input of the reception path can be coupled to an output of the duplexer. The reception path may comprise the filter arrangement with an amplifier and/or the filter arrangement with a mixer.

In one embodiment of the reception path, a plurality of filter arrangements are connected in series.

The inductive and/or capacitive component can be implemented as discrete components.

In one embodiment, the subtractor and also the first and second impedances are implemented in a common semiconductor body. The inductive component may comprise a coil produced using thin-film technology or a coil produced in three dimensions using microsystem technology. The capacitive component may be implemented as a plate capacitor in or on the semiconductor body.

In one alternative embodiment, the transceiver is implemented in a semiconductor body, with the transceiver comprising components of a reception path and of a transmission path. The reception path has at least one filter arrangement based on the proposed principle.

In one embodiment, a method for filtering an input signal comprises: the input signal is supplied to two impedances. The phases of the input signal are rotated on the basis of frequency by the two impedances. The signals which can be tapped off on the two outputs of the two impedances are subtracted from one another. A signal, namely the filtered output signal, is provided.

By specifying dimensions for the frequency-dependent phase shift in the impedances, in-phase signals are therefore advantageously almost eliminated by the subtractor and signals which are in phase opposition are passed by the subtractor.

In one embodiment, no information about a signal strength for the input signals at interfering frequencies is required to eliminate input signals at interfering frequencies.

In one embodiment, the complexity of components for the filter arrangement is low. An amplifier and/or a down-conversion mixer, which is provided for the reception path, may additionally be provided with the first and second impedances and, in addition, may also be used for filtering besides a function such as amplifying or down-conversion mixing.

In one embodiment, the filter arrangement can be implemented in a semiconductor body. This saves an external filter component and inputs and outputs which are routed to an external filter component.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed:

1. A filter arrangement having an input and an output, comprising:
    a first impedance comprising a first connection connected to the input of the filter arrangement, wherein the first impedance has a first resonant frequency,
    a second impedance comprising a first connection connected to the input of the filter arrangement, wherein the second impedance has a second resonant frequency that is higher than the first resonant frequency, wherein the first impedance and the second impedance comprise a circuit having inductance and capacitance,
    a subtractor having two inputs and an output, wherein a first input of the subtractor is connected to a second connection of the first impedance, a second input of the subtractor is connected to a second connection of the second impedance, and the output of the subtractor is connected to the output of the filter arrangement.

2. The filter arrangement as claimed in claim 1, wherein the first input of the subtractor and the second input of the subtractor are connected to a differential amplifier.

3. The filter arrangement as claimed in claim 1, wherein the output of the subtractor comprises a differential shape, and the output of the subtractor comprises a second connection that is connected to a second output of the filter arrangement.

4. The filter arrangement as claimed in claim 1, wherein a signal at the second connection of the first impedance is in a first frequency range, wherein the signal at the second connection of the first impedance is approximately in phase opposition to a signal at the second connection of the second impedance, and wherein the filter arrangement passes the signal at the second connection of the first impedance to the output of the filter arrangement.

5. The filter arrangement as claimed in claim 1, wherein a signal at the second connection of the first impedance is in a second frequency range, wherein the signal at the second connection of the first impedance is approximately in phase with a signal at the second connection of the second impedance, and wherein filter arrangement rejects the signal at the second connection of the first impedance.

6. The filter arrangement as claimed in claim 1, wherein if a frequency in the first frequency range is higher than a frequency in the second frequency range: the first resonant frequency is lower than the frequency in a first frequency range and is higher than the frequency in a second frequency range, wherein the filter arrangement is to pass the first frequency range and is to reject the second frequency range; and the second resonant frequency is higher than the frequency in a first frequency range, wherein the filter arrangement is to pass the first frequency range.

7. The filter arrangement as claimed in claim 1, wherein if a frequency in a first frequency range is lower than a frequency in a second frequency range: the first resonant frequency is lower than the frequency in the first frequency range, wherein the filter arrangement is to pass the first frequency range, and the second resonant frequency is higher than the frequency in the first frequency range and lower than the frequency in the second frequency range, wherein the filter arrangement is to pass the first frequency arrangement and is to reject the second frequency range.

8. The filter arrangement as claimed in claim 1, wherein the first impedance comprises a parallel resonant circuit comprising a first inductive component and a first capacitive component, and the second impedance comprises a parallel resonant circuit comprising a second inductive component and a second capacitive component.

9. The filter arrangement as claimed in claim 8, wherein the first inductive component or the first capacitive component or the second inductive component or the second capacitive component comprises a switch.

10. The filter arrangement as claimed in claim 8, wherein the first capacitive component or the second capacitive component comprises a varactor diode.

11. The filter arrangement as claimed in claim 1, wherein the first impedance or the second impedance is designed to be adjustable.

12. The filter arrangement as claimed in claim 1, wherein the subtractor is a differential amplifier.

13. The filter arrangement as claimed in claim 1, wherein the subtractor is a mixer with a differential input having two connections and a further input for supplying a mixed frequency.

14. The filter arrangement as claimed in claim 13, wherein the mixer is in the form of a down-conversion mixer.

15. A filter arrangement, comprising a subtractor having two inputs that are associated with a first and second impedance, respectively, wherein the respective impedances receive an input signal at their respective inputs and provide a difference in the phase rotation at their respective outputs in a passable frequency range of the filter arrangement of approximately 180°.

16. A transceiver arrangement, comprising: a transmission path with a transmission path output to which a duplexer is connected, the duplexer configured to be coupled to an antenna, and a reception path with a reception path input to which a duplex output is connected and with a filter arrangement, the filter arrangement comprising: a first impedance comprising a first connection connected to the input of the filter arrangement, wherein the first impedance has a first resonant frequency, a second impedance comprising a first connection connected to the input of the filter arrangement, wherein the second impedance has a second resonant frequency that is higher than the first resonant frequency, wherein the first impedance and the second impedance comprise a circuit having inductance and capacitance, a subtractor having two inputs and an output, wherein a first input of the subtractor is connected to a second connection of the first impedance, a second input of the subtractor is connected to a second connection of the second impedance, and the output of the subtractor is connected to the output of the filter arrangement.

17. The transceiver arrangement as claimed in claim 16, wherein the transceiver arrangement sends and receives information using code-division multiple access methods.

18. The transceiver arrangement as claimed in claim 16, wherein the transceiver arrangement is positioned in a reception path of a mobile radio communication appliance.

19. A method for filtering an input signal, comprising:
supplying the input signal to two impedances that facilitate a frequency-dependent phase shift,
subtracting a first and second signal, wherein the first and second signals are tapped off at an output of the two impedances;
providing an output signal as a result of the subtraction;
wherein the input signal has a frequency in a first frequency range, which is to be passed by the filter arrangement; and
wherein a phase of the input signal is shifted such that the first signal and the second signal are approximately 180-degrees phase shifted with respect to one another.

20. The method as claimed in claim 19, wherein the input signal has a frequency in a second frequency range, which is to be rejected by the filter arrangement; and wherein a phase of the input signal is shifted such that the first signal and the second signal are approximately in phase.

21. A method for selectively passing a first signal to an output of a filter arrangement, wherein the first signal has a first frequency, comprising:
comparing the first signal to a second signal that has a second frequency that is higher than the first frequency; wherein the first signal is passed if the first signal is approximately 180-degrees phase shifted with respect to the second signal; wherein the first signal is rejected if the first signal is approximately in phase with the second signal.

22. The method of claim 21, wherein the first frequency or the second frequency is adjustable.

* * * * *